(12) United States Patent
Chin

(10) Patent No.: US 8,192,177 B2
(45) Date of Patent: Jun. 5, 2012

(54) AUXILIARY COOLING DEVICE

(75) Inventor: Ke-Wei Chin, Taipei (TW)

(73) Assignee: Yeou Chih Corporation, Taipei (TW)

( * ) Notice: Subject to any disclaimer, the term of this patent is extended or adjusted under 35 U.S.C. 154(b) by 0 days.

(21) Appl. No.: 12/149,272

(22) Filed: Apr. 29, 2008

(65) Prior Publication Data

US 2010/0215520 A1    Aug. 26, 2010

(51) Int. Cl.
  *F04B 17/02* (2006.01)
(52) U.S. Cl. ............... 417/408; 417/423.5; 415/202; 361/695
(58) Field of Classification Search ............ 417/405, 417/408, 423.5; 415/202, 60, 66; 416/146 R; 361/695, 696, 697
See application file for complete search history.

(56) References Cited

U.S. PATENT DOCUMENTS

| | | | | |
|---|---|---|---|---|
| 1,529,568 A * | 3/1925 | Ananian | ............... | 446/207 |
| 5,160,811 A * | 11/1992 | Ritzmann | ............... | 174/68.3 |
| 5,422,787 A * | 6/1995 | Gourdine | ............... | 361/697 |
| 5,566,377 A * | 10/1996 | Lee | ............... | 361/695 |
| 6,145,586 A * | 11/2000 | Lo | ............... | 165/80.3 |
| 6,280,318 B1 * | 8/2001 | Criss-Puszkiewicz et al. | ............... | 454/184 |
| 6,920,044 B2 * | 7/2005 | Lin | ............... | 361/697 |
| 6,987,669 B2 * | 1/2006 | Chen | ............... | 361/695 |
| 7,758,322 B2 * | 7/2010 | Chang et al. | ............... | 417/408 |
| 2005/0184605 A1 * | 8/2005 | Vinson et al. | ............... | 310/68 R |
| 2006/0289532 A1 * | 12/2006 | Hsu et al. | ............... | 219/757 |
| 2007/0031248 A1 * | 2/2007 | Hsu et al. | ............... | 415/191 |

* cited by examiner

*Primary Examiner* — Devon C Kramer
*Assistant Examiner* — Nathan Zollinger
(74) *Attorney, Agent, or Firm* — Jackson IPG PLLC; Demian K. Jackson

(57) ABSTRACT

An auxiliary fan that can reduce electricity consumption and increase cooling effects. Air flow which comes from a DC cooling fan is guided to impel one or more auxiliary fans. The auxiliary fans blow and exhaust hot air to increase cooling effects.

2 Claims, 4 Drawing Sheets

AUXILIARY COOLING DEVICE

BACKGROUND OF THE INVENTION

1. Technical Field

The invention relates to an auxiliary fan that can not only reduce electricity consumption can also increase cooling effects. The invention guides air flow which comes from a DC cooling fan to impel one or more auxiliary fans. The auxiliary fan(s) can blow and exhaust hot air to increase cooling effects and can reduce the need for DC cooling fans.

2. Description of Related Art

In recent years, there are many new creative electronics. Communication products offer consumers better and more efficient products. These are made possible by the continuous efforts of engineers from various fields. Computer products play a representative role among all kinds of consumer electric products.

Most computer or electric devices contain components which will generate or keep heat. A system can get hot due to executed work. The most popular way to cool a system is by installing one or more DC cooling fans in the system to reduce heat by the air flow coming from DC fan(s).

Although the above mentioned cooling method can solve the heating problem, DC fans require electricity to work. Today, protecting our environment makes saving energy an important issue. Methods to reduce the waste of electricity meet the need to protect our environment.

There are several components in general computer systems and electric products, such as CPU, electro-coil, transformers, power supplies, Hard Discs, etc. In order to cool down the system, one or more electricity consuming DC cooling fan need to be installed in the system.

By doing this, the system is cooled. However, it also increases the burden of the power supply and power system and makes more heat. Obviously, it is not an idea solution and can not solve the heating problem efficiently.

By realization of the serious shortcomings of the traditional cooling devices and systems, the inventor made many studies and researches and finally created a revolutionary and practical cooling idea. The theory is using and guiding air from the DC cooling fan to impel one or more auxiliary fan(s). The cooling air coming from the DC cooling fan can execute its original cooling function. In addition, the DC cooling fan can impel the auxiliary fan(s) to work to increase the volume of air blown. By this operation, increased cooling effect and reduced use of DC fans will reduce heat.

SUMMARY OF THE INVENTION

This invention is a cooling fan device which does not directly need electric power. The auxiliary fan is particularly suitable to use in power supply, computer chassis and computer server systems in order to reduce temperatures and enhance cooling effects.

A special feature is to use the air from a DC cooling fan to impel one or more auxiliary fans. By this way, the need for DC cooling fans can be reduced and the auxiliary fan helps ventilation to increase cooling effects.

BRIEF DESCRIPTION OF THE DRAWINGS

The invention, as well as a preferred mode of use, further objectives and advantages, will best be understood by referring to the following detailed description of an illustrative embodiment when read in conjunction with the accompanying drawings, wherein.

DETAILED DESCRIPTION OF THE PREFERRED EMBODIMENT

Figure 1:
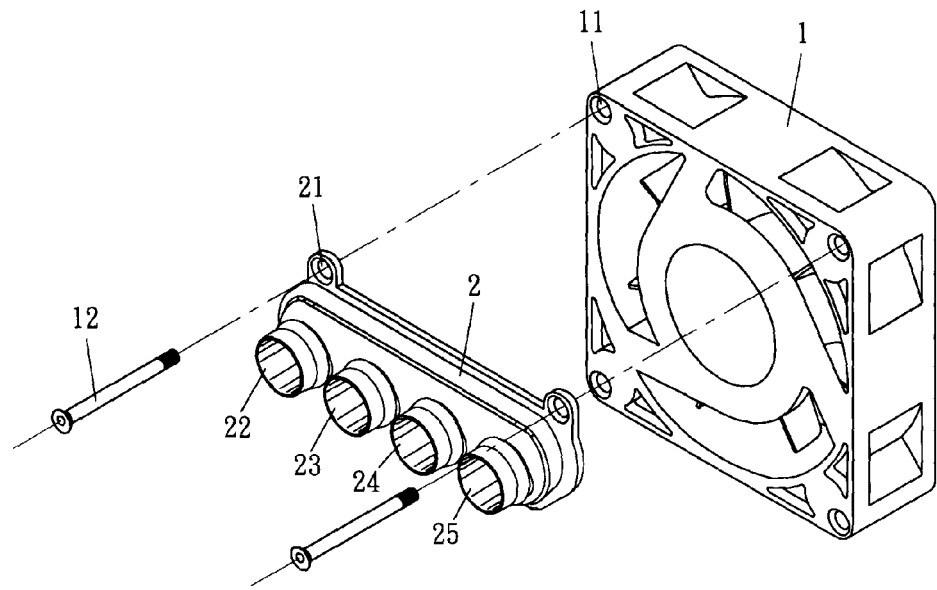
FIG. 1 is a perspective view to show this invention of an airflow guiding duct and DC cooling fan individually.

Please refer to FIGS. 1-8. This invention comprises the following stated parts: one airflow guiding duct 2 which can be attached on a DC cooling fan 1, one or more airflow guiding pipes 3, and one or more auxiliary fans 4.

Above mentioned, airflow guiding duct 2 has screw holes 21 and one or more tube connectors 22, 23, 24 & 25 on it and forms a bell shape opening mouth 26 with the jointing side of the DC cooling fan 1.

Figure 2:
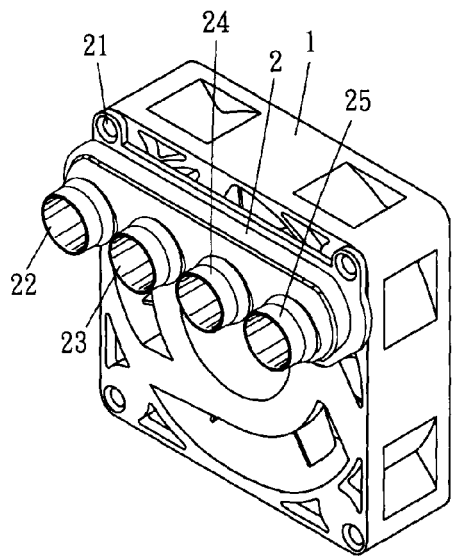
FIG. 2 is a perspective view to show the invention of an airflow guiding duct and DC cooling fan combined together.

Please refer to FIG. 2. The airflow guiding duct 2 is attached with the DC cooling fan 1 by the screw hole 21 on the airflow guiding duct 2 and screw hole 11 of the DC cooling fan 11, by fastening the screw 12 to the DC cooling fan 1 the airflow guiding duct 2 is fastened with the DC cooling fan 1.

The bell shaped opening mouth 26 on the airflow guiding duct 2 directs some air from the DC cooling fan 1 to the airflow channel's tube connectors 22, 23, 24 & 25.

The above mentioned way to fasten the airflow guiding duct 2 with DC cooling fan 1 is not limited to above stated screw holes 21, 11 but can include fastening by hooks or other ways.

Figure 3:
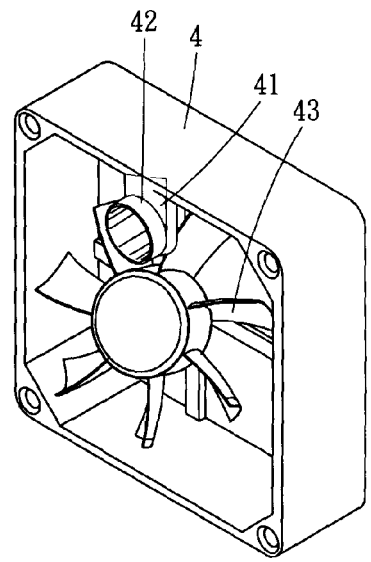
FIG. 3 is a perspective view to show the invention of auxiliary fan.

Please refer to FIG. 3. The auxiliary cooling fan 4 for this device includes one or more oblique panels 41 which are used to impel the fan blades 43 at a proper angle. There is one or more respective tube connecting pipe or fastener 42 on oblique panel 41.

The connecting pipe or fastener 42 on the above stated oblique panel 41 is not limited to the tube type connecting pipe which is adopted in this invention. Anything which can position or fasten one side of the airflow guiding pipe 3 can be included.

Figure 4:
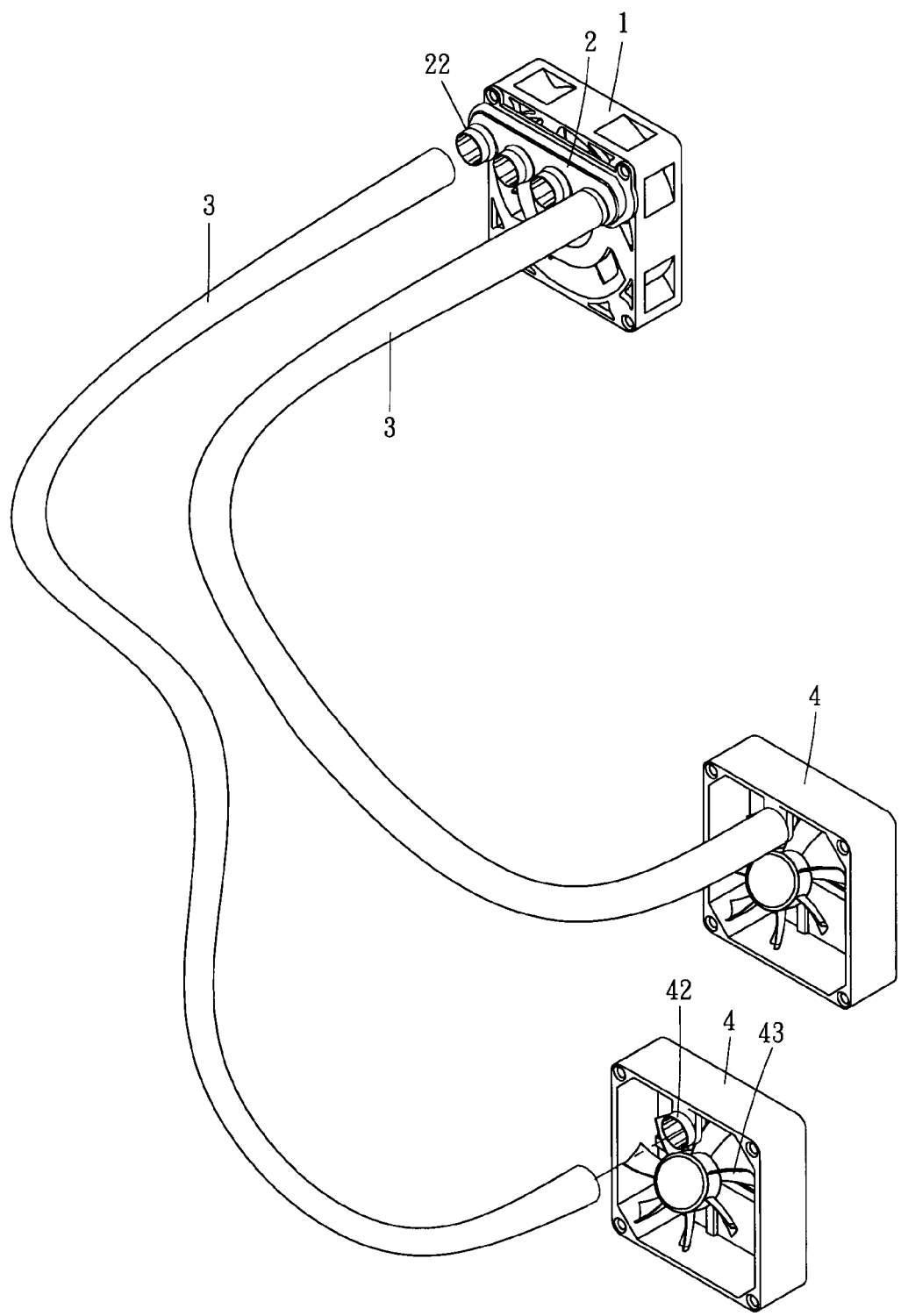
FIG. 4 is a perspective view to how the example of connecting the invention of auxiliary cooling fan and DC cooling Fan.

Please refer to FIG. 4. The airflow guiding pipe(s) 3 in this device attach at to one side of the airflow guiding duct 2 attaches at any airflow channel's tube connectors 22, 23, 24 & 25. The other side attaches or fixes on connecting pipe of fastener 42 which is on the oblique panel 41 of auxiliary fan 4.

When the DC cooling fan 1 is operating, part of the air flow therefrom will be guided through the middle of airflow guiding duct 2 and airflow guiding pipe 3 to impel auxiliary fan(s) 4 to run and blow air to cool a designated heat generator or exhaust the hot air in that environment area to outside of a chassis. In the meantime, it will not affect cooling function of the DC cooling Fan 1.

Figure 5:
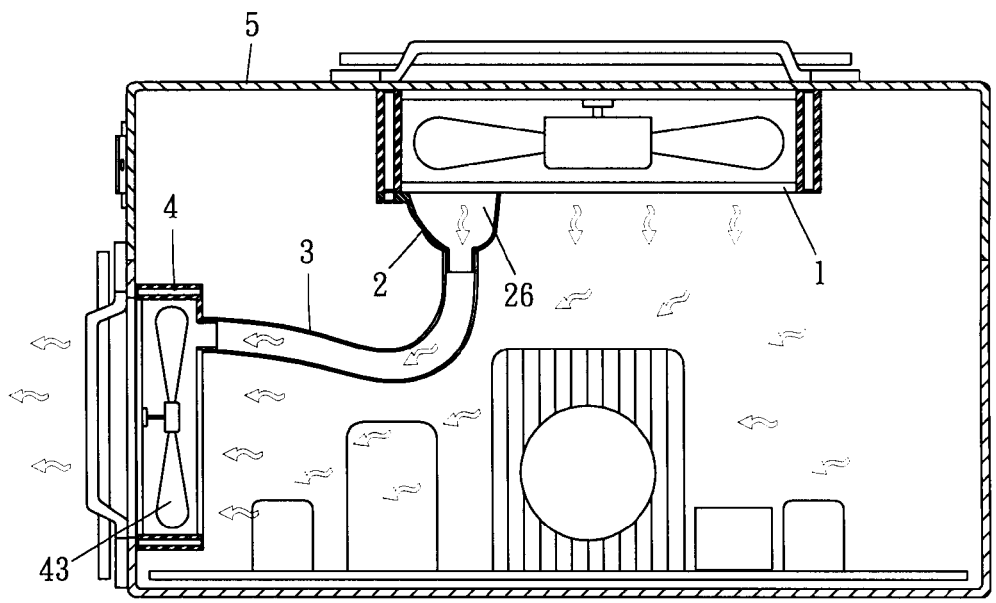
FIG. 5 is a diagram to show the implementation of this invention on computer power supply.
Figure 6:
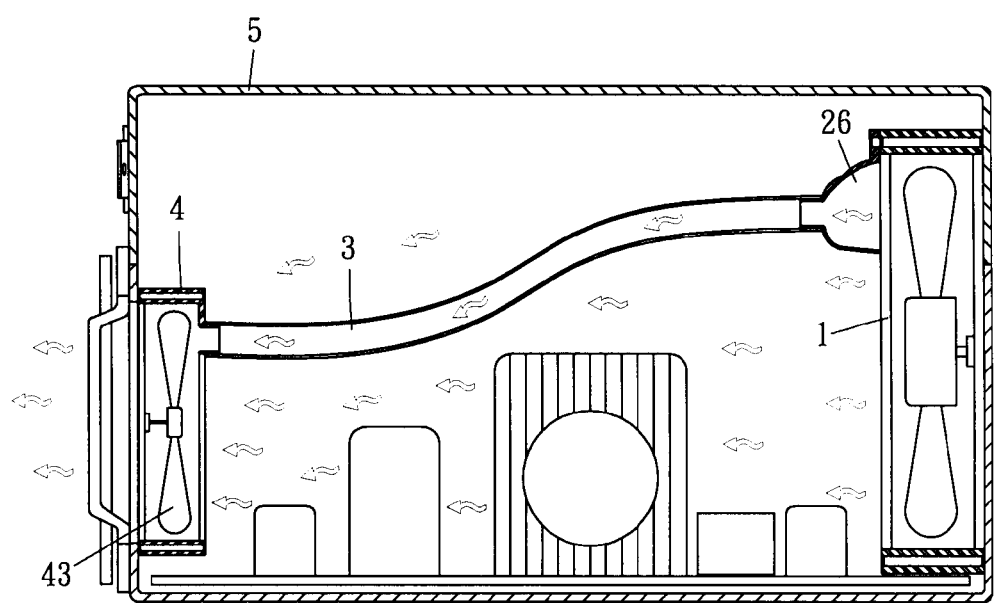
FIG. 6 is another diagram to show the implementation of this invention on computer power supply.

Please refer to FIGS. 5 to 6 showing this invention's implementing example in a computer power supply. An airflow guiding duct 2 is attached to the DC cooling fan 1 which is originally installed in the power supply 5. The auxiliary cooling fan 4 is fixed on or near the inner side of the power supply 5 casing and connected to the airflow guiding pipe 3 and thus to any of the airflow channel's tube connectors 22, 23, 24 & 25 which are on the airflow guiding duct 2.

Figure 7:
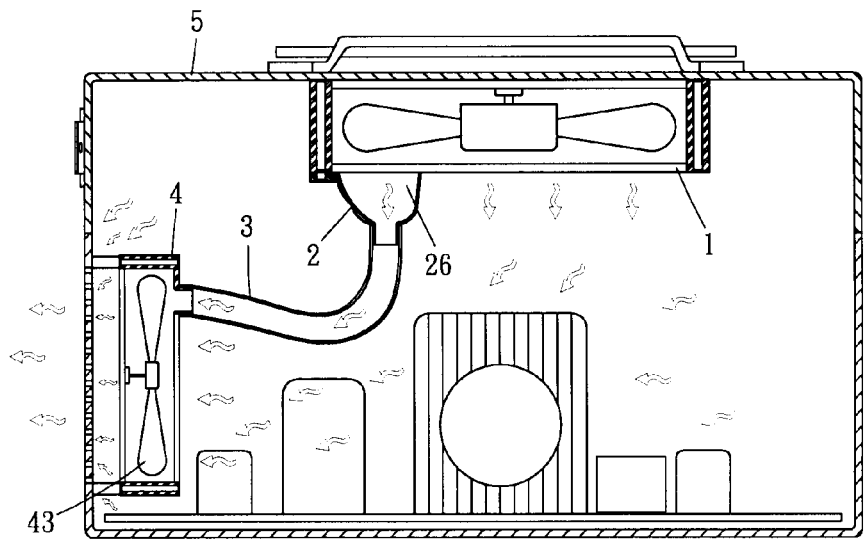
FIG. 7 is another diagram to show the implementation of this invention on computer power supply.
Figure 8:
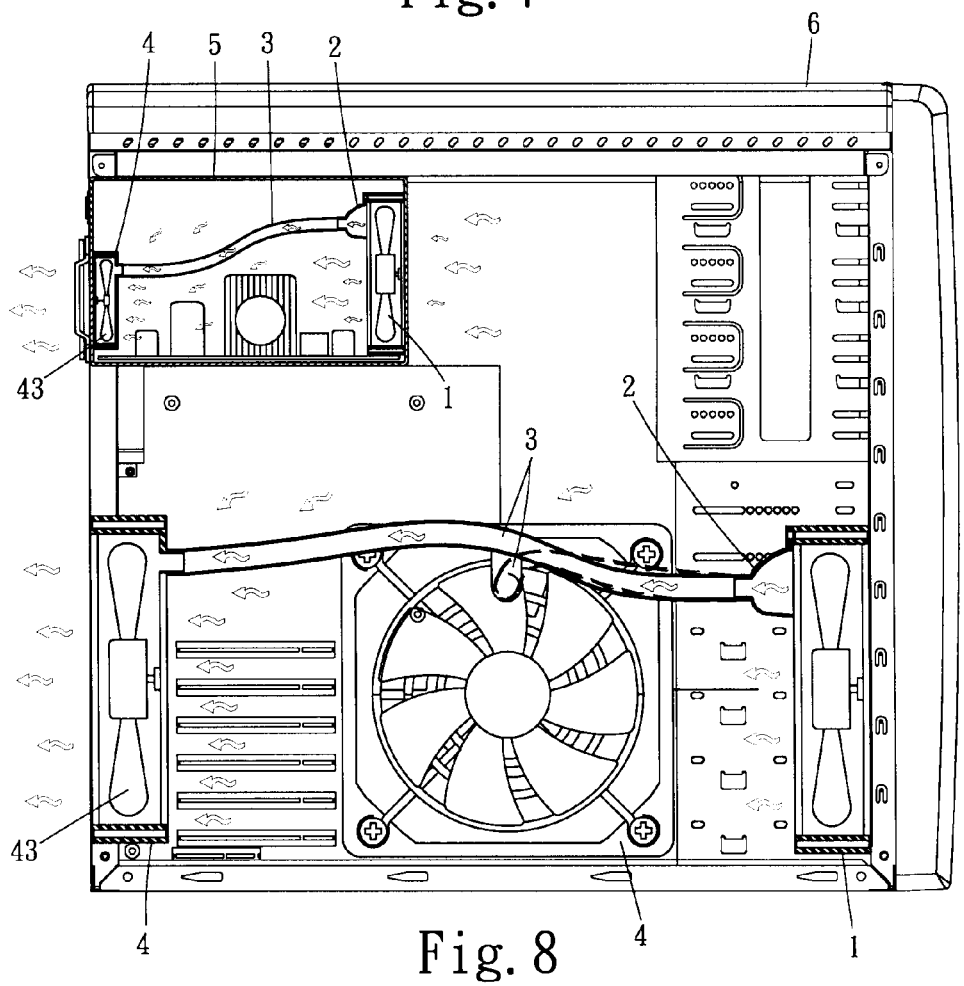
FIG. 8 is a diagram to show the implementation of this invention on computer chassis.

Please refer to FIGS. 7 and 8. The airflow duct 2 is attached to the DC cooling fan 1 which is originally installed in the computer chassis. One or more auxiliary cooling fans 4 are affixed on or near the inside of the rear or side panels of the computer chassis and/or to the designated surrounding heat generator devices, such as Hard Disc, CPU heat sink or electro-coils. A required number of airflow guiding pipes 3 are connected to the airflow channel's tube connectors 22, 23, 24 & 25 of the airflow guiding duct 2 and the connecting pipe or fastener 42 on the oblique panel 41 which is on auxiliary fan(s) 4.

The auxiliary cooling device can take advantage of the DC cooling fan 1 which is originally installed on the computer power supply 5 or computer chassis 6 to guide airflow to airflow guiding pipe 3 to impel one or more auxiliary fan(s) 4.

By this operation, the cooling function of original DC cooling fan 1 is not reduced, but rather the needs for DC cooling fan 1 are reduced. The auxiliary cooling fan(s) 4 helps blow and exhaust air to enhance cooling effects and the numbers of installing DC cooling fan 1 can be reduced.

What is claimed is:

1. An auxiliary cooling device comprising:
    an airflow guiding duct comprising a bell shape opening configured for attachment to an existing DC cooling fan and a plurality of tube connectors;
    a plurality of airflow guiding pipes, wherein each airflow guiding pipe is connected at a first end with a respective tube connector; and
    a plurality of auxiliary fans, each auxiliary fan comprising fan blades and at least one oblique panel and connecting fastener attached to a second end of a respective airflow guiding pipe such that some air from the existing DC cooling fan is diverted to impel the fan blades of each auxiliary fan so as to blow air therefrom to direct cooling air at a designated heat generator or to exhaust hot air from an environment area to enhance the cooling effects of the existing DC cooling fan,
    wherein both the at least one oblique panel and the connecting fastener are located off-center with respect to a rotational axis of the fan blades.

2. An auxiliary cooling arrangement comprising:
    a DC cooling fan;
    an airflow guiding duct comprising:
        a bell shape opening configured for attachment to the DC cooling fan and a plurality of tube connectors and
        a plurality of airflow guiding pipes, wherein each airflow guiding pipe is connected at a first end with a respective tube connector; and
    a plurality of auxiliary fans, each auxiliary fan comprising fan blades and at least one oblique panel and connecting fastener attached to a second end of a respective airflow guiding pipe such that some air from the DC cooling fan is diverted to impel the fan blades of each auxiliary fan so as to blow air therefrom to direct cooling air at a designated heat generator or to exhaust hot air from an environment area to enhance the cooling effects of the DC cooling fan,
    wherein both the at least one oblique panel and the connecting fastener are located off-center with respect to a rotational axis of the fan blades.

\* \* \* \* \*